(12) United States Patent
Takagiwa

(10) Patent No.: US 8,223,542 B2
(45) Date of Patent: Jul. 17, 2012

(54) METHOD OF READING DATA IN SEMICONDUCTOR MEMORY DEVICE WITH CHARGE ACCUMULATION LAYER

(75) Inventor: Teruo Takagiwa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 204 days.

(21) Appl. No.: 12/852,028

(22) Filed: Aug. 6, 2010

(65) Prior Publication Data

US 2011/0032760 A1 Feb. 10, 2011

(30) Foreign Application Priority Data

Aug. 7, 2009 (JP) ................................. 2009-184789

(51) Int. Cl.
  *G11C 11/34* (2006.01)
(52) U.S. Cl. ............... 365/185.03; 365/185.05; 365/200
(58) Field of Classification Search ............. 365/185.03, 365/185.05, 200
  See application file for complete search history.

(56) References Cited

U.S. PATENT DOCUMENTS 5,513,333 A * 4/1996 Kynett et al. ................. 711/103

FOREIGN PATENT DOCUMENTS

| JP | 2004-192789 | 7/2004 |
|---|---|---|
| JP | 2007-193911 | 8/2007 |
| JP | 2007-207332 | 8/2007 |

* cited by examiner

*Primary Examiner* — Jason Lappas

(74) *Attorney, Agent, or Firm* — Oblon, Spivak, McClelland, Maier & Neustadt, L.L.P.

(57) ABSTRACT

According to one embodiment, a method of reading data in a semiconductor memory device including a plurality of memory cells associated with rows and columns and a plurality of latch circuits associated with the columns includes reading flag data from the memory cells associated with one of the columns into associated one of the latch circuits, selecting one of the latch circuits sequentially, while shifting one of the latch circuits to be selected, and reading the flag data from one of the latch circuits selected in an $N^{th}$ one of the shifts. N is an integer not less than 0).

17 Claims, 11 Drawing Sheets

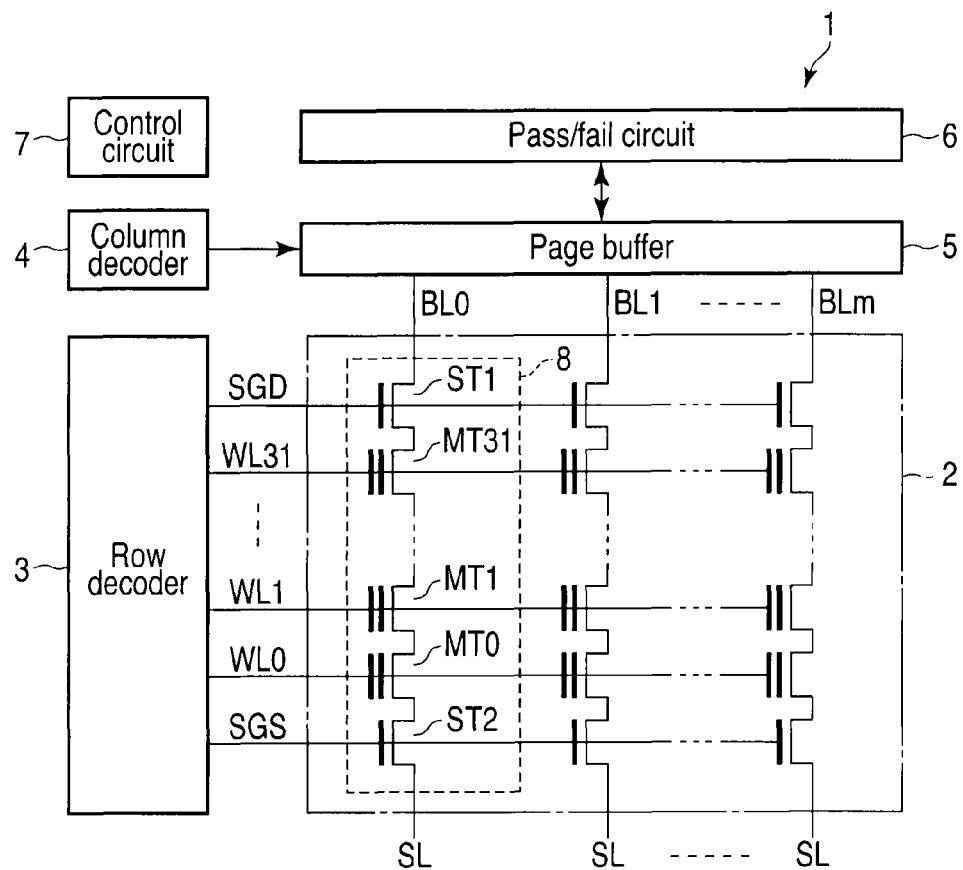
F I G. 1
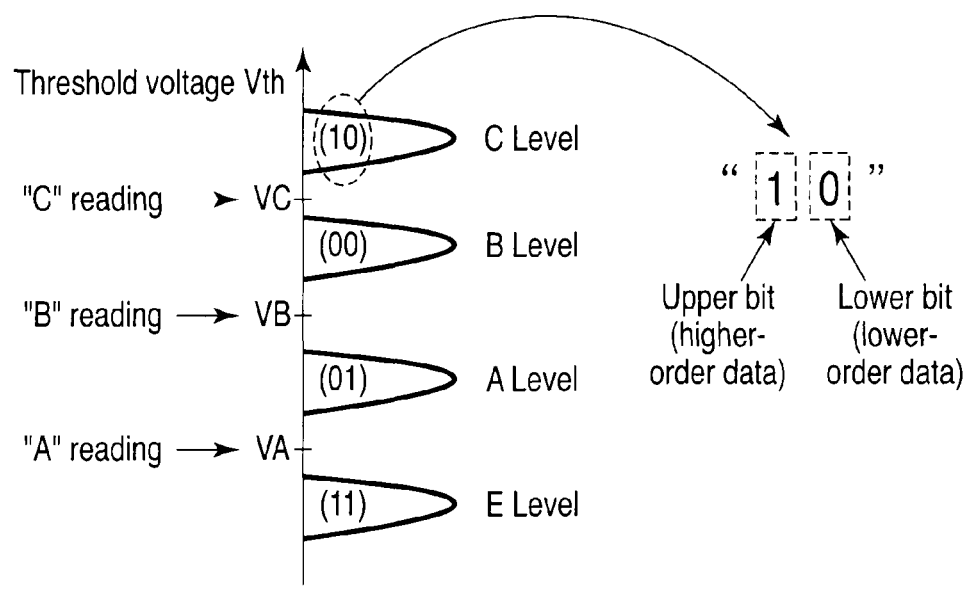
F I G. 2

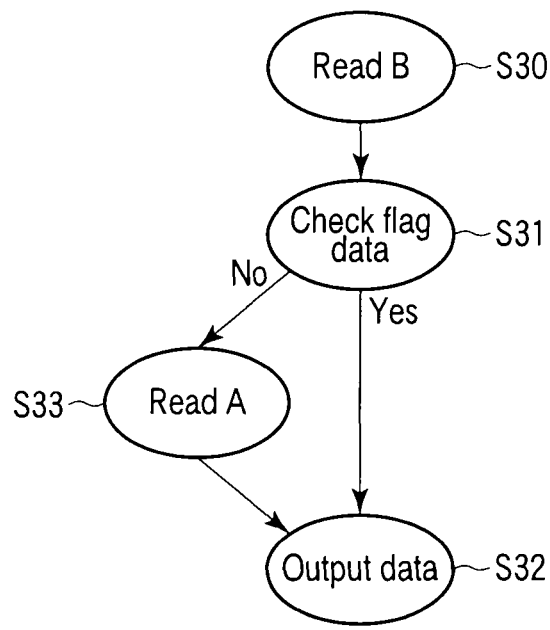
F I G. 10
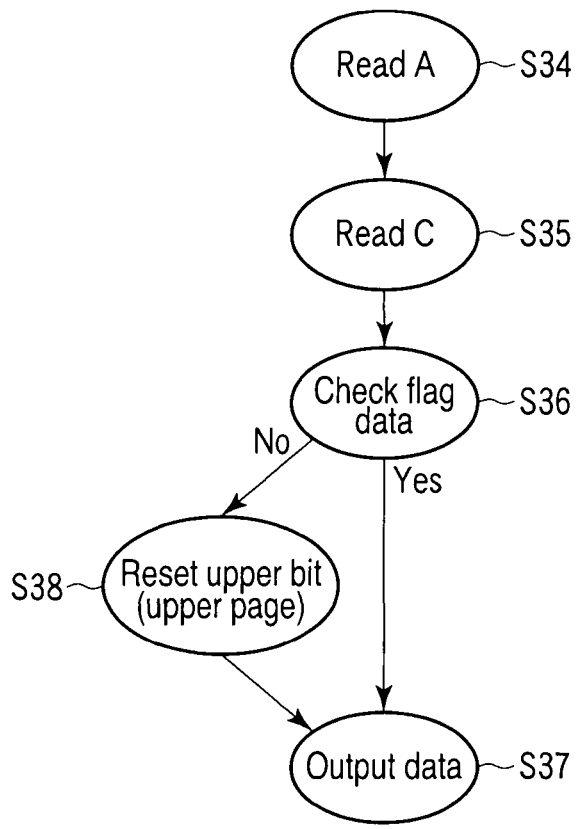
F I G. 11

| Net data | Flag data | Redundancy data |

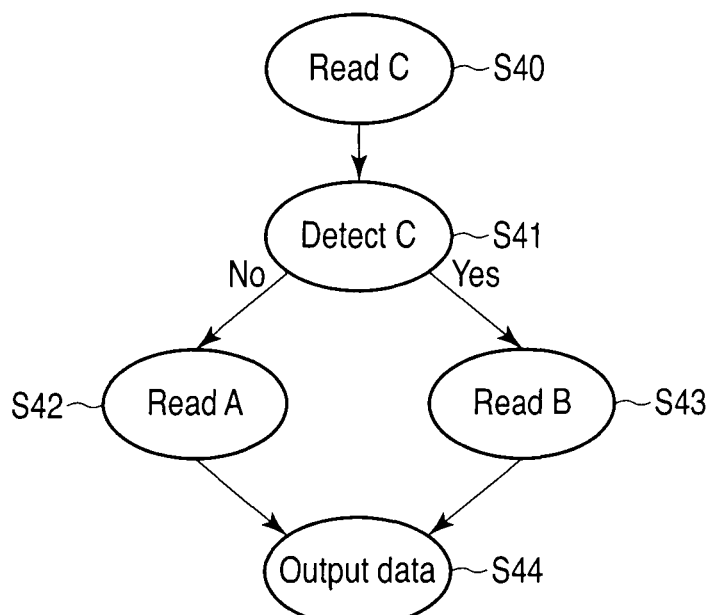
F I G. 14
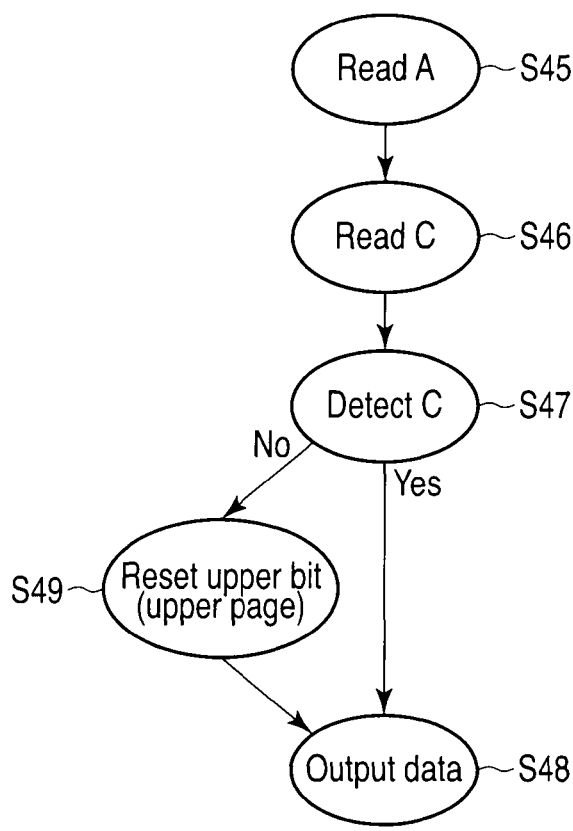
F I G. 15

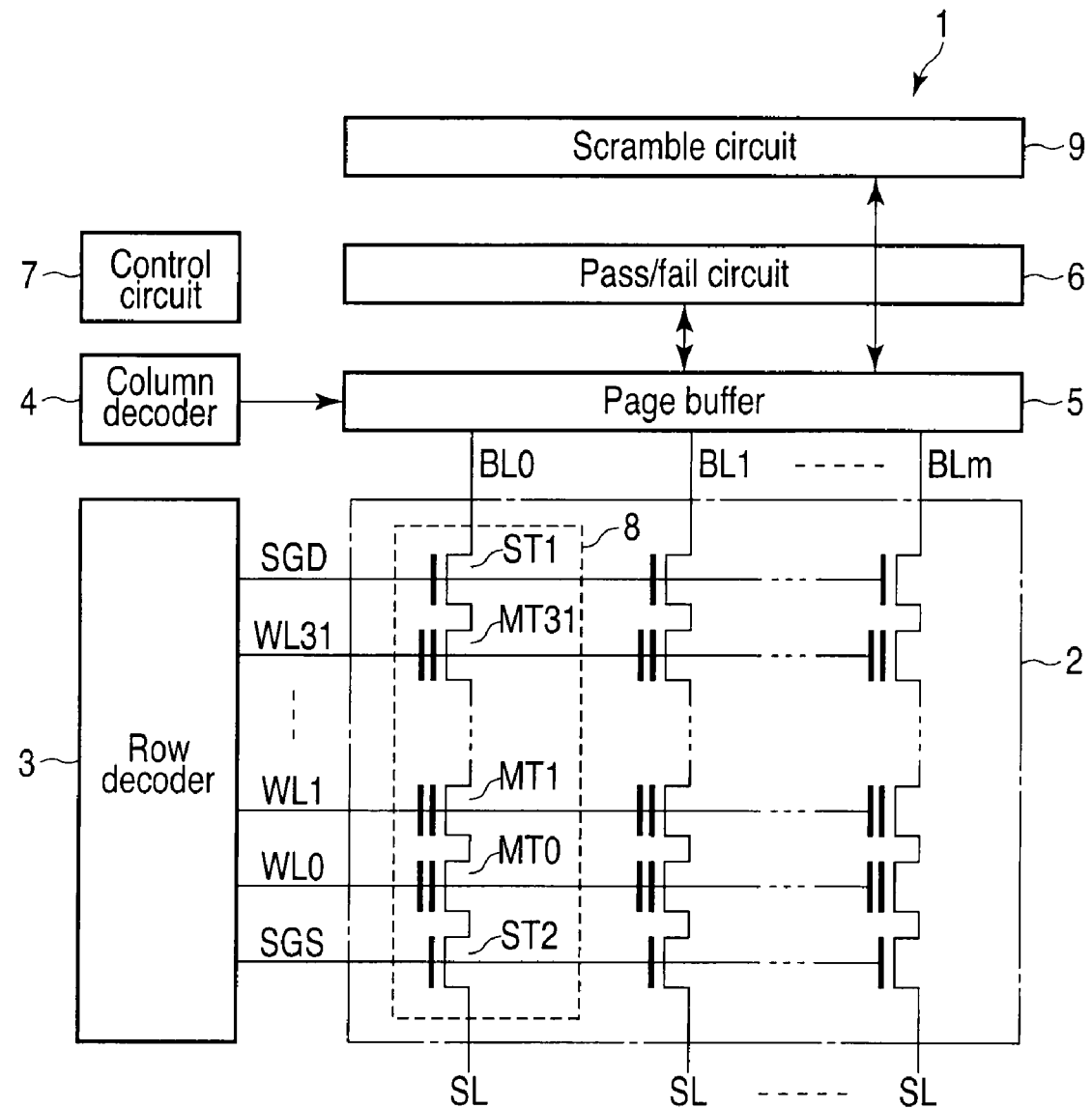
F I G. 16

METHOD OF READING DATA IN SEMICONDUCTOR MEMORY DEVICE WITH CHARGE ACCUMULATION LAYER

CROSS-REFERENCE TO RELATED APPLICATIONS

This application is based upon and claims the benefit of priority from Japanese Patent Application No. 2009-184789, filed Aug. 7, 2009; the entire contents of which are incorporated herein by reference.

FIELD

Embodiments described herein relate generally to a method of reading data in a semiconductor memory device with a charge storage layer, and more particularly to a multilevel NAND flash memory.

BACKGROUND

A multilevel NAND flash memory where each of the memory cells can hold two or more bits of data has been known. It is known that flag data indicating how many pages of memory cells have been written (e.g., indicating data has been written only up to the lower page or already up to the upper page) is used in a multilevel NAND flash memory. Such a technique has been disclosed in, for example, Japanese Patent No. 3935139. When data is read, the flag data is checked in advance, which enables a proper read operation.

However, the conventional method requires time to check the flag data. This might prevent the NAND flash memory from operating at higher speed or make the circuit size larger.

BRIEF DESCRIPTION OF THE DRAWINGS

FIG. 1 is a block diagram of a flash memory according to a first embodiment;
FIG. 2 is a graph showing a threshold value distribution of a memory cell according to the first embodiment;
FIGS. 9, 10, and 11 are flowcharts to explain the operation of a flash memory according to the first embodiment;
FIGS. 14 and 15 are flowcharts to explain the operation of a flash memory according to the second embodiment;
FIG. 16 is a block diagram of a flash memory according to a third embodiment.

DETAILED DESCRIPTION

Figure 3:
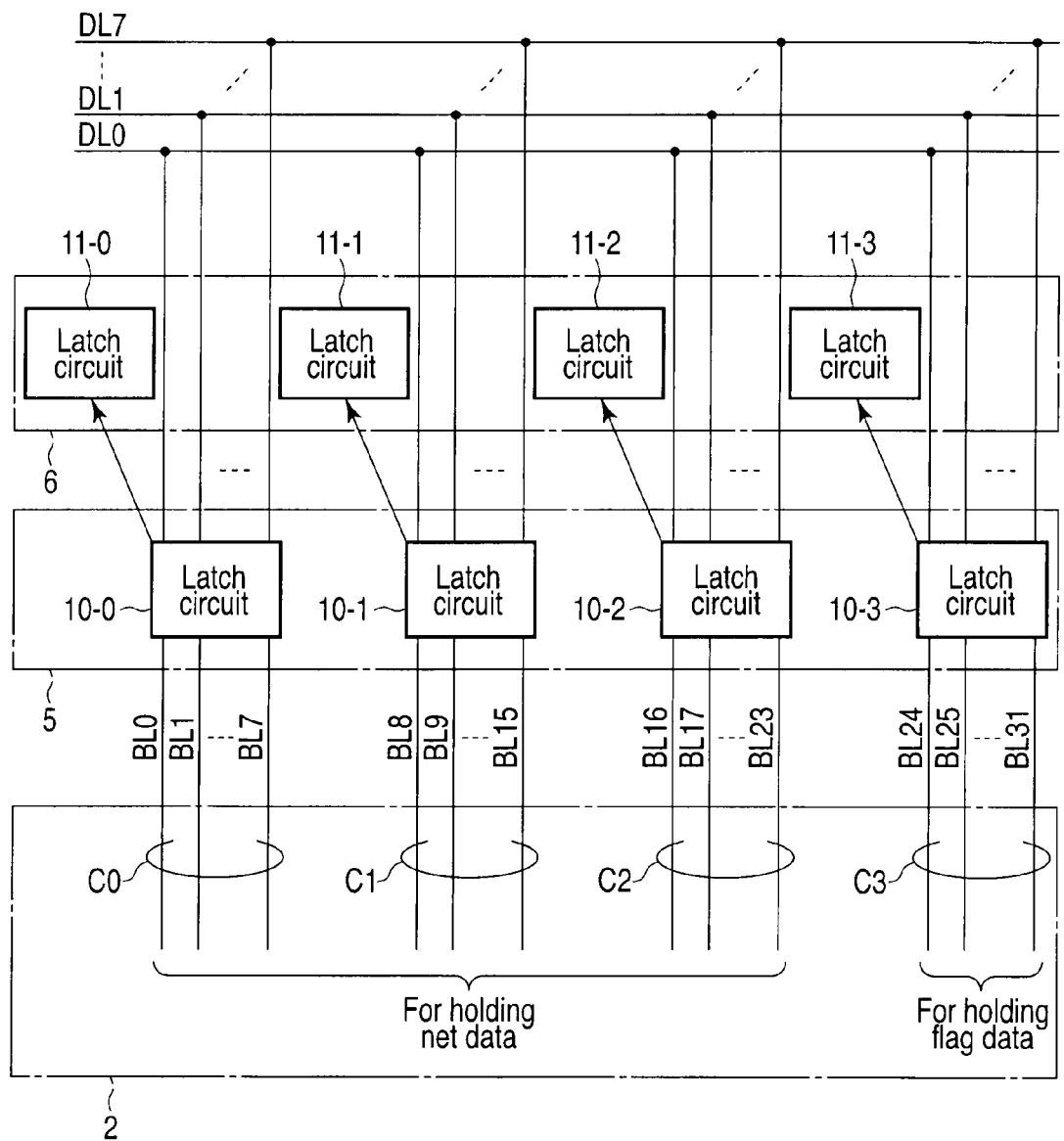
FIG. 3 is a block diagram of a page buffer and a pass/fail circuit according to the first embodiment.

In general, according to one embodiment, a method of reading data in a semiconductor memory device including a plurality of memory cells associated with rows and columns and a plurality of latch circuits associated with the columns includes: reading flag data from the memory cells associated with one of the columns into associated one of the latch circuits; selecting one of the latch circuits sequentially, while shifting one of the latch circuits to be selected; and reading the flag data from one of the latch circuits selected in an $N^{th}$ one of the shifts. N is an integer not less than 0).

[First Embodiment]
A method of reading data in a semiconductor memory device according to a first embodiment will be explained, taking a multilevel NAND flash memory as an example.
<Overall Configuration of NAND Flash Memory>
FIG. 1 is a block diagram of a four-level NAND flash memory according to the first embodiment. As shown in FIG. 1, the NAND flash memory 1 includes a memory cell array 2, a row decoder 3, a column decoder 4, a page buffer 5, a pass/fail circuit 6, and a control circuit 7.

As shown in FIG. 1, the memory cell array 2 includes a plurality of NAND cells 8. Each of the NAND cells 8 includes, for example, 32 memory cell transistors MT0 to MT31 and select transistors ST1, ST2. Hereinafter, when there is no need to distinguish between memory cell transistors MT0 to MT31, they will simply be referred to as memory cell transistors MT. Each of the memory cell transistors MT has a stacked gate structure including a charge accumulation layer (e.g., a floating gate), formed on a semiconductor substrate with a gate insulating film interposed therebetween, and a control gate formed on the charge accumulation layer with an inter-gate insulating film interposed therebetween. The number of memory cell transistors MT is not limited to 32 and may be 8, 16, 64, 128, and 256. The number of memory cell transistors MT is not restrictive. The charge accumulation layer may be made of insulating material. Adjacent memory cell transistors MT share a source and a drain. The memory cell transistors MT are arranged between select transistors ST1, ST2 in such a manner that their current paths are connected in series. The drain on one end side of the memory cell transistors MT connected in series is connected to the source of select transistor ST1 and the source on the other end side is connected to the drain of select transistor ST2.

The control gates of memory cell transistors MT in the same row are connected equally to any one of word lines WL0 to WL31. The gates of select transistors ST1 in the same row are connected equally to a select gate line SGD. The gates of select transistors ST2 in the same row are connected equally to a select gate line SGS. Hereinafter, word lines WL0 to WL31 will sometimes simply be referred to as word lines WL. The drain of select transistor ST1 is connected to any one of bit lines BL0 to BLm (m being a natural number not less than 1). The sources of the select transistors ST2 are connected equally to source line SL. When there is no need to distinguish between bit lines BL0 to BLm, they will simply be referred to as bit lines BL.

With the above configuration, a plurality of NAND cells 8 sharing word lines WL and select gate line SGD, SGS form a unit called a block. Data in the memory cell transistors MT in the same block are erased en bloc. A plurality of memory cell transistors MT connected to the same word line WL are written to en bloc. This unit is called a page.

While in FIG. 1, only one block is shown, two or more blocks may be provided along a bit line BL. In this case, NAND cells 8 in the same column in the memory cell array 2 are connected equally to the same bit line BL.

Next, data the memory cell transistors MT can take will be explained. A memory cell transistor MT is configured to be capable of holding, for example, two bits of data according to the threshold voltage. FIG. 2 is a graph showing a threshold value distribution of a memory cell transistor MT, with threshold voltages Vth plotted on the ordinate and the existence probability of memory cell transistor MT plotted on the abscissa.

As shown in FIG. 2, each of the memory cell transistors MT can hold four-level data. More specifically, the memory cell transistor MT can hold four types of data, "E" level, "A" level, "B" level, and "C" level in ascending order of threshold voltage Vth.

"E" level is an erase level. Its threshold voltage VthE satisfies the expression VthE<VA. Threshold voltage VthA of "A" level satisfies the expression VA<VthA<VB. Threshold voltage VthB of "B" level satisfies the expression VB<VthB<VC. Threshold voltage VthC of "C" level satisfies the expression VC<VthC.

"E" level, "A" level, "B" level, and "C" level correspond to "11," "01," "00," and "10" in binary notation, respectively. The individual bits of the two-bit data are referred to as an upper bit (higher-order data) and a lower bit (lower-order data), respectively, as shown in FIG. 2. The relationship between "E" to "C" levels and "00" to "11" is not limited to FIG. 2 and may be selected suitably.

As described above, data is written en bloc into and read en bloc from the memory cell transistors MT connected to the same word line WL. At this time, only the lower bits or upper bits in data are written and read en bloc. Therefore, when the memory cell transistors MT hold two-bit data, two pages are allocated to each word line WL. Hereinafter, a page into which or from which the lower bits are written or read en bloc is referred to as a lower page. A page into which or from which the upper bits are written or read en bloc is referred to as an upper page.

Reading data using voltage VC as a read level (i.e., determining whether the threshold level is "C" level or not higher than "B" level) is referred to as "C" reading. Reading data using voltage VB (i.e., determining whether the threshold level is not lower than "B" level or not higher than "B" level) is referred to as "B" reading. In addition, reading data using voltage VA (i.e., determining whether the threshold level is not lower than "A" level or equal to "E" level) is referred to as "A" reading.

To return to FIG. 1, the row decoder 3 selects a row direction of the memory cell array 2. That is, the row decoder 3 selects a word line WL. Then, the row decoder 3 applies suitable voltages to the selected word line WL and the unselected word lines WL.

In writing data, the page buffer 5 temporarily holds write data supplied from the outside and transfers the write data to a bit line BL, thereby writing data en bloc in pages. In reading data, the page buffer 5 senses and amplifies the data read in pages onto the bit line, holds the amplified data temporarily, and outputs the data to the outside.

The column decoder 4 selects a column direction of the memory cell array 2. That is, the column decoder 4 selects a bit line BL and, for example, in a read operation, instructs the page buffer 5 to output data corresponding to the selected bit line BL.

The pass/fail circuit 6, for example, in a test operation, can hold information as to whether there is a failure in the columns of the memory cell array 2.

The control circuit 7 supervises the entire operation of the NAND flash memory 1. That is, in writing, reading, and erasing data, the control circuit 7 controls the operations of the row decoder 3, column decoder 4, page buffer 5, and pass/fail circuit 6.

<Page Buffer, Pass/Fail Circuit, and Memory Cell Array>

Next, the page buffer 5, pass/fail circuit 6, and memory cell array 2 will be explained in detail with reference to FIG. 3.

FIG. 3 is a block diagram of the page buffer 5, pass/fail circuit 6, and memory cell array 2. To simplify the explanation, a case where the number of bit lines BL is 32 (m=31) is taken as an example. Of course, the number of bit lines BL is not restricted to 32.

First, the page buffer 5 will be explained. The page buffer 5 includes a plurality of latch circuits 10-0 to 10-3 each caused to correspond to, for example, 8 bit lines BL. Hereinafter, when there is no need to distinguish between latch circuits 10-0 to 10-3, they will simply be referred to as latch circuits 10.

Latch circuit 10-0 corresponds to bit lines BL0 to BL7. In reading data, latch circuit 10-0 temporarily holds data items read onto bit lines BL0 to BL7 and outputs them to data lines DL0 to DL7, respectively. In writing data, latch circuit 10-0 temporarily holds data items supplied from data lines DL0 to DL7 and transfers them to bit lines BL0 to BL7, respectively.

Latch circuit 10-1 corresponds to bit lines BL8 to BL15. In reading data, latch circuit 10-1 temporarily holds data items read onto bit lines BL8 to BL15 and outputs them to data lines DL0 to DL7, respectively. In writing data, latch circuit 10-1 temporarily holds data items supplied from data lines DL0 to DL7 and transfers them to bit lines BL8 to BL15, respectively.

Latch circuit 10-2 corresponds to bit lines BL16 to BL23. In reading data, latch circuit 10-2 temporarily holds data items read onto bit lines BL16 to BL23 and outputs them to data lines DL0 to DL7, respectively. In writing data, latch circuit 10-2 temporarily holds data items supplied from data lines DL0 to DL7 and transfers them to bit lines BL16 to BL23, respectively.

Latch circuit 10-3 corresponds to bit lines BL24 to BL31. In reading data, latch circuit 10-3 temporarily holds data items read onto bit lines BL24 to BL31 and outputs them to data lines DL0 to DL7, respectively. In writing data, latch circuit 10-3 temporarily holds data items supplied from data lines DL0 to DL7 and transfers them to bit lines BL24 to BL31, respectively.

In a normal read operation, data is read en bloc as described above. That is, data items are read onto bit lines BL0 to BL31 simultaneously and these are stored in latch circuits 10-0 to 10-3, respectively. Thereafter, latch circuit 10 selected by the column decoder 4 outputs data to the outside via data lines DL0 to DL7. Conversely, in a write operation, write data is stored in latch circuits 10-0 to 10-3 sequentially via data lines DL0 to DL7. When the memory cell transistors MT are actually programmed, latch circuits 10-0 to 10-3 transfer data en bloc onto bit liens BL0 to BL31.

Next, the pass/fail circuit 6 will be explained. Like the page buffer, the pass/fail circuit 6 includes a plurality of latch circuits 11-0 to 11-3 each associated to 8 bit lines. Hereinafter, when there is no need to distinguish between latch circuits 11-0 to 11-3, they will simply be referred to as latch circuits 11.

Latch circuit 11-0 corresponds to bit lines BL0 to BL7. Latch circuit 11-0 is configured to be capable of holding data in latch circuit 10-0 and the number of failures existing on bit lines BL0 to BL7.

Latch circuit 11-1 corresponds to bit lines BL8 to BL15. Latch circuit 11-1 is configured to be capable of holding data in latch circuit 10-1 and the number of failures existing on bit lines BL8 to BL15.

Latch circuit 11-2 corresponds to bit lines BL16 to BL23. Latch circuit 11-2 is configured to be capable of holding data in latch circuit 10-2 and the number of failures existing on bit lines BL16 to BL23.

Latch circuit 11-3 corresponds to bit lines BL24 to BL31. Latch circuit 11-3 is configured to be capable of holding data in latch circuit 10-3 and the number of failures existing on bit lines BL23 to BL31.

With the above configuration, bit lines BL0 to BL7 are collectively called column C0, bit lines BL8 to BL15 are collectively called column C1, bit lines BL16 to BL23 are collectively called column C2 and bit lines BL24 to BL31 are collectively called column C3. When there is no need to distinguish between column C0 to C3, they will be simply referred to as column C. That is, data is exchanged between the page buffer and the outside in columns C. Latch circuits 10-0 to 10-3 corresponds to columns C0 to C3. The same holds true for latch circuits 11-0 to 11-3.

Hereinafter, although one column includes 8 bit lines, the number of bit lines is not limited to 8. The correspondence between each column C and the individual bit lines BL is not restricted to FIG. 3 and may be selected suitably.

In the memory cell array 2, for example, the memory cell transistors MT corresponding to columns C0 to C2 (or connected to bit lines BL0 to BL23) are used to hold net data. In contrast, for example, the memory cell transistors MT corresponding to column C3 (or connected to bit lines BL24 to BL31) are used to hold flag data (which may be referred to as the LM flag).

Flag data is written into the memory cell transistors MT in column C3 on a word line basis. Flag data is information that indicates whether the memory cell transistors MT connected to the word line WL have been written into only the lower page or already up to the upper page (i.e. both the lower page and upper page is written).

It is seen from FIG. 2 that, if the memory cell transistors MT have been written into only the lower page, they can take only two states: a state where they have a threshold value corresponding to "E" level and a state where they have a threshold value corresponding to not lower than "A" level. In contrast, when the memory cell transistors MT have been written up to the upper page, they can take four states: "E" level, "A" level, "B" level, and "C" level.

<Write Operation>

Next, a write operation in the NAND flash memory 1 configured as described above will be explained.

Figure 4:
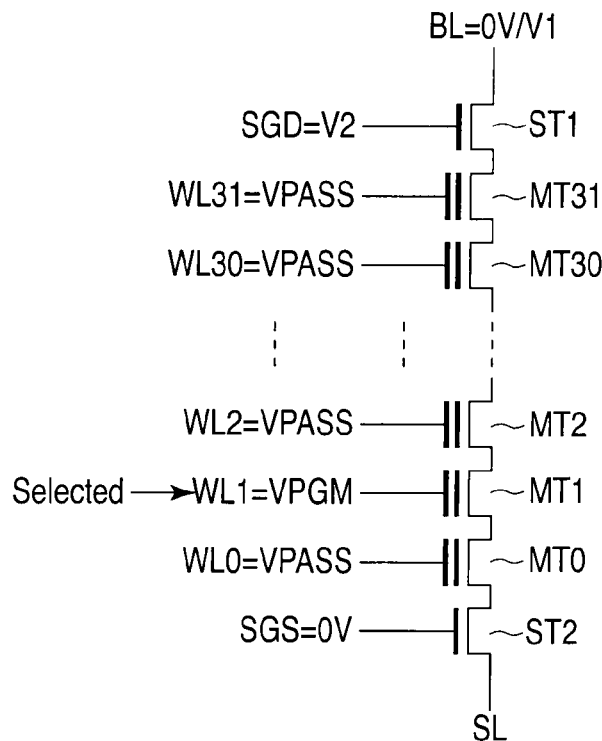
FIGS. 4 and 5 are circuit diagrams of a NAND cell.

FIG. 4 is a circuit diagram of a NAND cell 8 in writing data. Hereinafter, a case where data is written into memory cell transistor MT1 connected to word line WL1 will be explained.

First, the page buffer 5 transfers write data to bit line BL. More specifically, when the threshold value of memory cell transistors MT is raised by injecting charge into the charge accumulation layer, a write voltage (e.g., 0 V) is applied to bit line BL. When no charge is injected, a write inhibit voltage (e.g., V1>0 V) is applied to bit line BL. At this time, flag data has been stored in latch circuit 10-3.

Then, the row decoder 3 selects word line WL1 and applies voltage VPGM to selected word line WL1 and voltage VPASS to unselected word lines WL0, WL2 to WL31. Voltage VPGM is a high voltage (e.g., about 20 V) for injecting charge into the charge accumulation layer. Voltage VPASS is a voltage that turns on the memory cell transistors MT, regardless of what data the memory cell transistors MT hold.

In addition, the row decoder 3 applies voltage V2 and 0 V to select gate lines SGD, SGS, respectively. Voltage V2 is a voltage that turns on select transistor ST1 if the write voltage (0 V) has been applied to bit line BL and turns off select transistor ST1 if the write inhibit voltage (V1) has been applied to bit line BL.

As a result, a channel is formed in every memory cell transistor MT0 to MT31 connected to word lines WL0 to WL31. If the write voltage (0 V) has been applied to bit line BL, select transistor ST1 turns on, causing the write voltage to be transferred to the channel of memory cell transistor MT1. As a result, in memory cell transistor MT1, a large potential difference develops between the control gate and channel, causing charge to be injected into the charge storage layer. If write inhibit voltage V1 has been applied to the bit line, select transistor ST1 turns off, causing the channel of memory cell transistor MT1 to electrically float. The potential of the channel rises to almost VPGM by coupling with the control gate. Consequently, the potential difference between the control gate and channel decreases, which suppresses the injection of charge into the charge accumulation layer.

By the above operations, net data is written into columns C0 to C2 and flag data is written into column C3.

<Read Operation>

Figure 5:
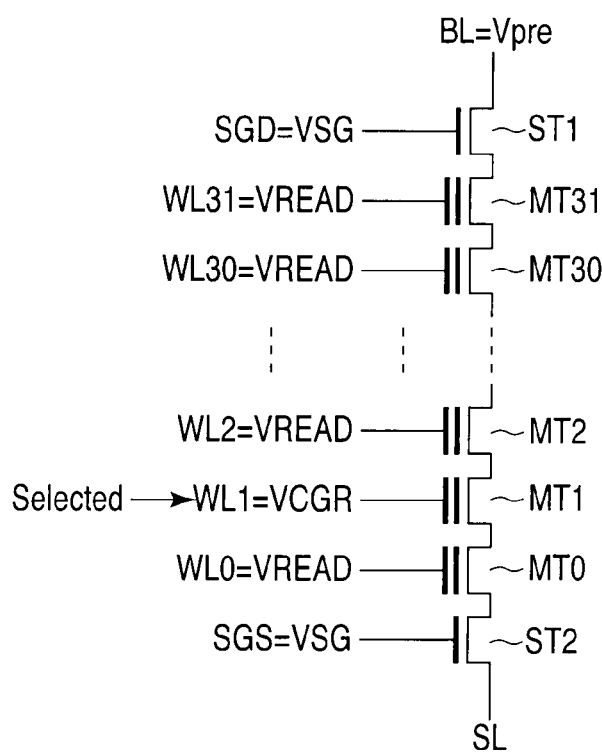

Next, a read operation will be explained with reference to FIG. 5. FIG. 5 is a circuit diagram of a NAND cell 8 in reading data. Hereinafter, as in a write operation, a case where word line WL1 is selected will be explained.

First, the page buffer 5 precharges bit line BL to bring the potential of bit line BL to VPRE (e.g., 0.7 V). The potential of source line SL is set at, for example, 0 V.

In addition, the row decoder 3 selects word line WL1 and applies read voltage VCGR to selected word line WL1. Read voltage VCGR is, for example, any one of VA, VB, and VC shown in FIG. 2 and varies when any one of "A" reading to "C" reading is performed. Furthermore, the row decoder 3 applies voltage VREAD to unselected word lines WL0, WL2 to WL31. Voltage VREAD is a voltage that turns on the memory cell transistors MT, regardless of what data the memory cell transistors MT hold. Moreover, the row decoder 3 applies voltage VSG to select gate lines SGD, SGS. Voltage VSG is a voltage that turns on select transistors ST1, ST2.

As a result, memory cell transistors MT0, MT2 to MT31 connected to unselected word lines WL0, WL2 to WL31 turn on, forming a channel in each of the transistors. Select transistors ST1, ST2 are also turned on.

If memory cell transistor MT connected to selected word line WL1 is turned on, this makes bit line BL and source line SL electrically conducting. That is, current flows from bit line BL to source line SL. If memory cell transistor MT is off, this makes bit line BL and source line SL electrically nonconducting. That is, no current flows from bit line BL to source line SL. By the above operation, data is read from all the bit lines simultaneously.

Then, the page buffer 5 senses current flowing in bit line BL and determines data, depending on whether the current has exceeded a certain threshold value Ith.

<Details of Read Operation>

The read operation will be explained in detail. When data is read, the control circuit 7 has to recognize which column C corresponds to flag data. This operation will be explained under the caption "Determination of column C."

<Determination of Column C>

Figure 6:
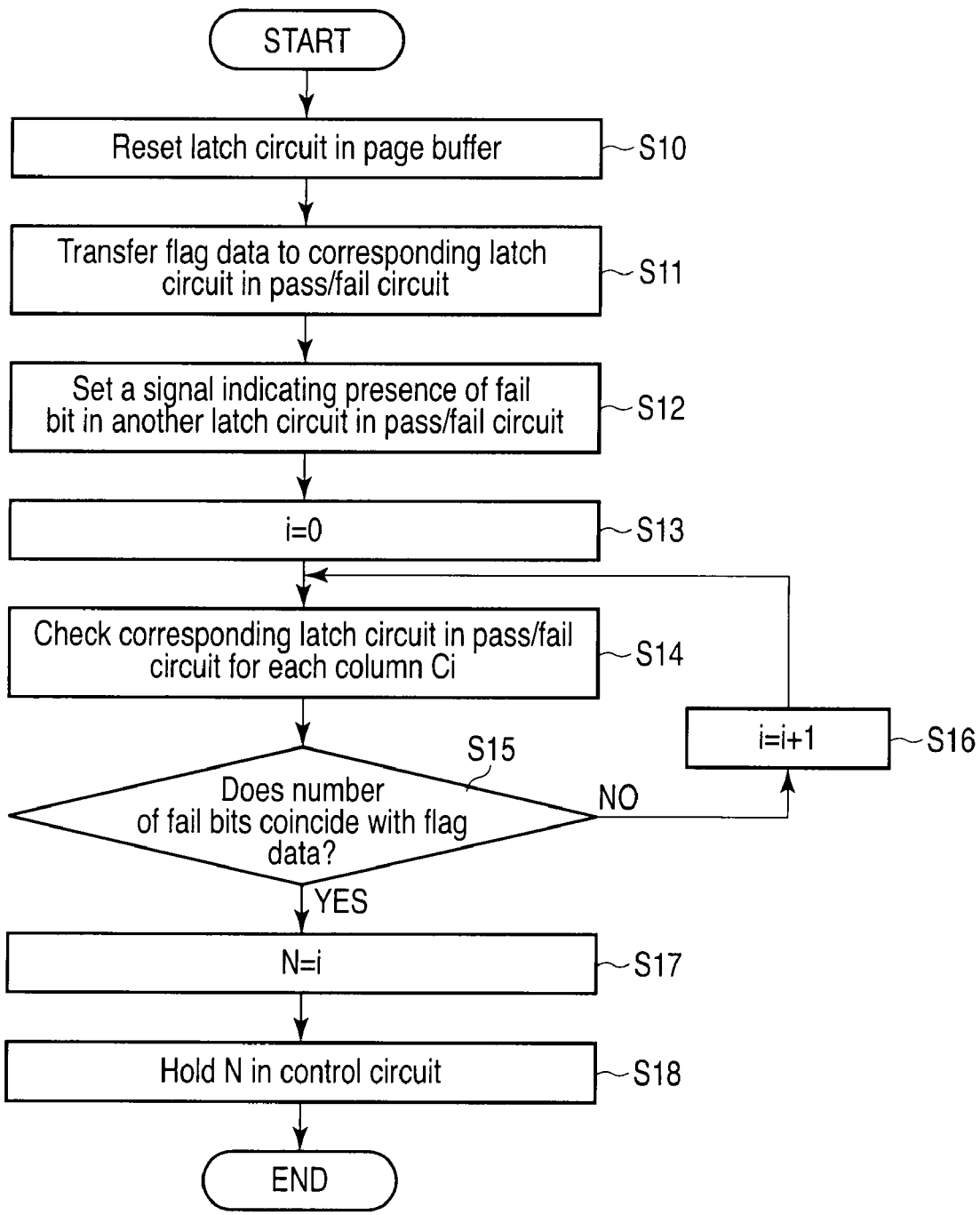
FIG. 6 is a flowchart to explain the operation of a flash memory according to the first embodiment.

FIG. 6 is a flowchart to explain the flow of determination of column C. The operation for determination of column C may be carried out at any time before data is read for the first time. For example, the determination may be made when the power supply of NAND flash memory 1 is turned on, immediately before data is read, or when data is written. When the determination is made at the time that the power supply is turned on, the operation may be included in a boot program executed immediately after the power supply is turned on.

Initially, the control circuit 7 resets latch circuits 10-0 to 10-3 of the page buffer 5 (step S10). Then, flag data is transferred to the corresponding latch circuit 11 in the pass/fail circuit 6 (step S11).

Then, the control circuit 7 sets a signal indicating the presence of a fail bit in another latch circuit 11 in the pass/fail circuit 6 in the form of the number of failure bits (step S12). As this signal, for example, all bits may be "1s" or "0s." In addition, any data that can be distinguished from the flag data may be used.

Thereafter, the control circuit 7 focuses on column C0 (i=0) (step S13). Then, the pass/fail circuit 6 selects latch circuit 11-$i$ corresponding to column Ci and checks the number of failure bits held in latch circuit 11-$i$ (step S14). More specifically, the pass/fail circuit 6 determines whether the number of failure bits coincides with flag data. Flag data is a unique value, "81H" in this example. "H" indicates the number in front of it is hexadecimal.

If the number of failure bits does not coincide with flag data (NO in step S15), latch circuit 11 to be selected is shifted (step S16). That is, i is incremented by one, giving i=i+1. Then, control is returned to step S14 and the same operations are repeated.

If the number of failure bits coincides with flag data (YES in step S15), the control circuit 7 determines that column Ci corresponds to flag data (step S17) and holds the value N=i (step S18). The process in step S15 may be accepted even if all the bits in the number of failure bits have not been checked. That is, "81H" is "1000_0001b" in a binary notation and "FFH" is "1111_1111b" in binary notation. Therefore, for example, if there are four or more "0s" in the data representing the number of failure bits, it may be determined that the column corresponds to flag data. Of course, a determination may be made on the basis of the number of binary "1s."

Figure 7:
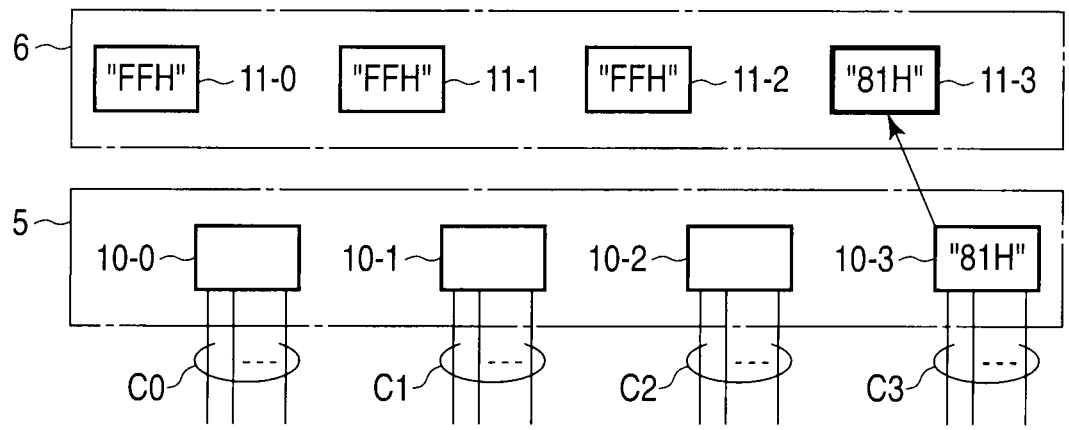
FIGS. 7 and 8 are block diagrams of a page buffer and a pass/fail circuit according to the first embodiment.
Figure 8:
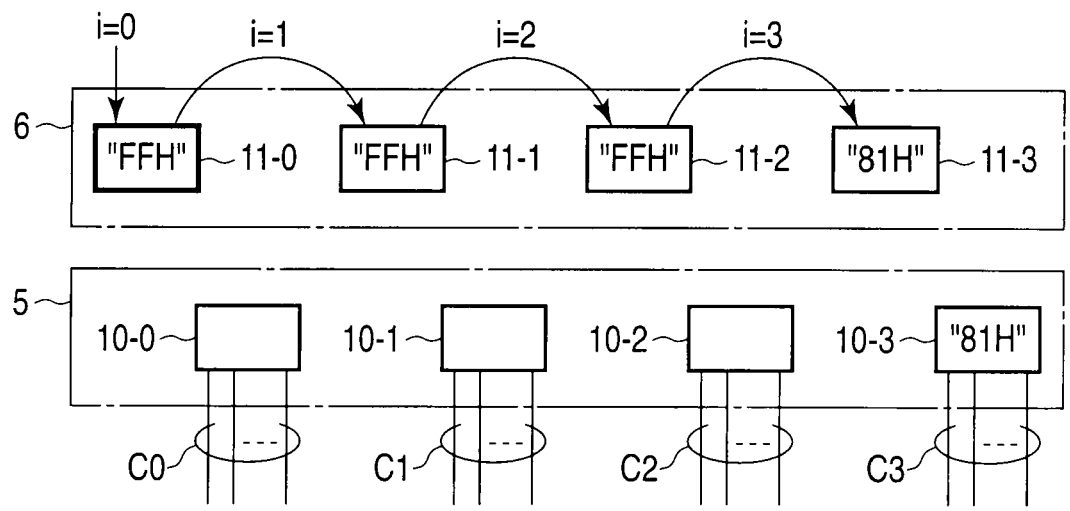

FIGS. 7 and 8 show specific examples of what has been described above. FIGS. 7 and 8 are block diagrams of the page buffer 5 and pass/fail circuit 6. FIG. 7 shows how steps S10 to S12 are carried out. As shown in FIG. 7, in the page buffer 5, flag data "81H" is stored in latch circuit 10-3 corresponding to column C3 that holds flag data and is transferred to latch circuit 11-3 in the pass/fail circuit 6 (steps S10 to S11). In addition, "FFH" or all binary "1s" (the number of failure bits) is stored in other latch circuits 11-0 to 11-2 (step S12).

FIG. 8 shows how steps S13 to S17 are carried out. As shown in FIG. 8, first, the control circuit 7 selects latch circuit 11-0 by giving i=0 and determines whether the number of failure bits in latch circuit 11-0 coincides with flag data (steps S13 to S14). Since the number of failure bits="FFH" and flag data="81H," they do not coincide with each other (NO in step S15). Accordingly, the control circuit 7 gives i=i+1 (step S16) and selects latch circuit 11-1. However, the number of failure bits in latch circuit 11-1 does not coincide with flag data (NO in steps S14 and S15). Therefore, the control circuit 7 gives i=i+1=2 (step S16) to select latch circuit 11-2. However, the number of failure bits in latch circuit 11-2 does not coincide with flag data (NO in steps S14 and S15). Therefore, the control circuit 7 gives i=i+1=3 (step S16) to select latch circuit 11-3.

Then, the number of failure bits in latch circuit 11-3 is "81H" and coincides with flag data. Accordingly, the control circuit 7 holds i=3 at this time as "N" (step S18). That is, the control circuit 7 can determine that column C3 lies in the position specified by the flag data.

<Flag Data Load Operation>

Next, a flag data load operation will be explained. Flag data may differ from one word line WL to another. It is conceivable that both the upper page and lower page has been written for a certain word line WL and only the lower page has been written for another word line WL. Therefore, when reading data from each word line WL, the control circuit 7 reads flag data for the word line WL in advance. This is a flag data load operation.

Figure 9:
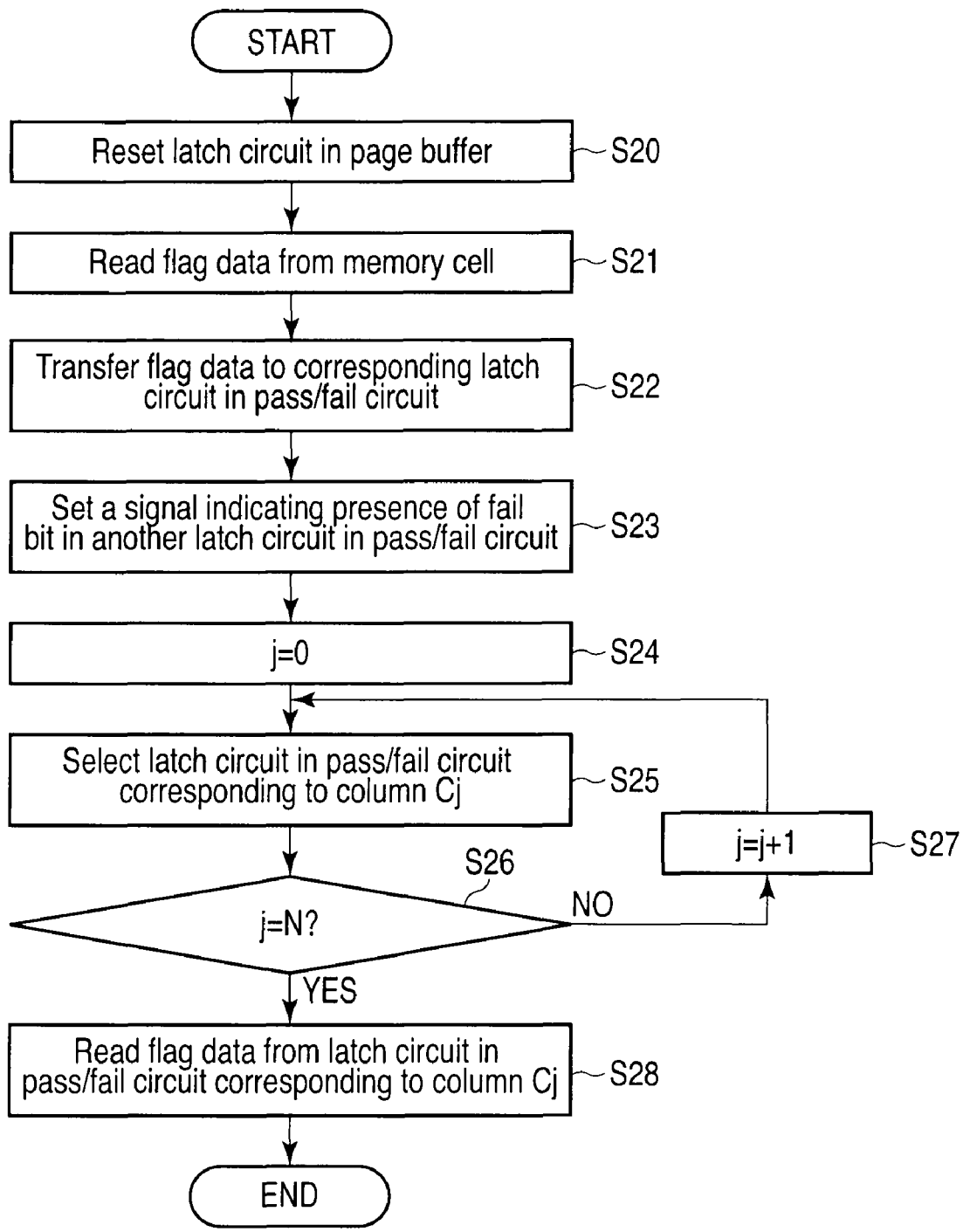

FIG. 9 is a flowchart to explain a flag data load operation. As shown in FIG. 9, first, the control circuit 7 resets latch circuits 10-0 to 10-3 (step S20). Then, the control circuit 7 reads flag data from memory cell transistor MT in column C3 into the page buffer 5 (step S21). The flag data is stored in latch circuit 10-3. Then, the control circuit 7 transfers the flag data from the page buffer 5 to the pass/fail circuit 6 (step S22). Consequently, the flag data is stored in latch circuit 10-3. The control circuit 7 sets a signal indicating the presence of a failure bit in the other latch circuits 11-0 to 11-2 in the pass/fail circuit 6 as the number of failure bits (step S23). As this signal, for example, all bits may be binary "1s" or binary "0s." Any data may be used as the signal, provided that the data can be distinguished from flag data.

Thereafter, the control circuit 7 focuses on column C0 (j=0) (step S24). Then, the pass/fail circuit 6 selects latch circuit 11-$j$ corresponding to column Cj (step S25). The control circuit 7 increments j by one until j has reached N, thereby shifting latch circuit 11 to be selected (steps S26, S27). Then, when j has reached N (Yes in step S26), or when j=3 has been reached or latch circuit 11-3 has been selected, the control circuit 7 reads the number of failure bits held in the latch circuit 11-3 as flag data (step S28). In other words, the control circuit 7 selects latch circuit 11 with a failure bit, while shifting the latch circuit 11 sequentially. Then, the control circuit 7 reads flag data from latch circuit 11 selected in an $N^{th}$ shift.

As a result, the control circuit 7 can acquire flag data for the word line WL. The operation of sequentially shifting latch circuit 11 to be selected is the same as described in FIG. 8. The reset operation in step S20 may be eliminated. The reason is that latch circuit 10 enables data to be overwritten and therefore there is no need to reset data.

<Read Sequence>

Next, a method of reading data by use of the flag data will be explained with reference to FIGS. 10 and 11. FIGS. 10 and 11 are flowcharts for reading the lower page and upper page, respectively.

Data is read, starting with, for example, the lower page. As shown in FIG. 10, the control circuit 7 performs "B" reading (step S30). That is, in FIG. 5, the control circuit 7 sets voltage VCGR=VB to perform reading.

Thereafter, the control circuit 7 checks the flag data read by the flag read operation (step S31). If having determined from the flag data that data has been written up to the upper page for the word line WL (word line WL1 in the example of FIG. 5) (YES in step S31), the control circuit 7 causes the page buffer 5 to output the data as lower page data (step S32). That is, data of the lower page is determined by "B" reading without "A" reading. In contrast, if having determined that data has been written only to the lower page for the word line WL (NO in step S31), the control circuit 7 then performs "A" reading and, on the basis of the result, determines data of the lower page (step S33), and outputs the data (step S32).

After the operation of FIG. 10, the upper page is read. As shown in FIG. 11, the control circuit 7 performs "A" reading and then "B" reading (steps S34, S35). That is, in FIG. 5, the control circuit 7 sets voltage VCGR=VA, VB and performs reading sequentially.

Thereafter, the control circuit 7 checks the flag data which is read in the flag read operation (step S36). When having determined from the flag data that data has been written up to the upper page for the word line WL (YES in step S36), the control circuit 7 causes the page buffer 5 to output data as upper page data (step S37). That is, as a result of steps S34 and S35, data of the upper page is determined. In contrast, if having determined that data has been written only to the lower page for the word line WL (NO in step S36), the control circuit 7 resets data of the upper page (step S38) and outputs the data (step S37).

<Effect of the First Embodiment>

As described above, with the method of reading data in the semiconductor memory device according to the first embodiment, the operation performance can be increased, while suppressing an increase in the circuit size. This effect will be explained below.

A multilevel NAND flash memory uses flag data that indicates whether data has been written to both the lower page and the upper page or only to the lower page for each of the word lines. The flag data is written to any one of the memory cell transistors MT on the corresponding word line.

Accordingly, when data is read, first, the flag data is read and checked. Therefore, the system has to determine the position of the memory cell transistor MT in which the flag data has been written.

To do this, a method of causing the system to store the address (column address) of the memory cell transistor in advance has been considered. With this method, however, another decoder for decoding the address is needed, causing the problem of increasing the circuit area. In addition, decoding must be performed each time reading is done, causing the problem of reducing the operating speed.

However, with the method of the first embodiment, the above problem can be solved. In the first embodiment, information as to where the column holding flag data stands in the order of columns counted from a reference one (e.g., the endmost column) is held (i.e., "N" is held) without holding an address. In order to read the flag data, the target latch circuit 11 is shifted sequentially and the number of failure bits is read from the latch circuit 11 selected after N shifts as explained in FIG. 9. Of course, the number of failure bits, which has been read, is the flag data itself. Accordingly, a decoder is not needed and therefore an increase in the circuit area can be suppressed. To obtain "N," the target latch circuit 11 is shifted as explained in FIGS. 6 to 8. Therefore, a decoder is not needed.

Once "N" has been obtained, there is no need to find "N" since then. Flag data can be obtained by just shifting the latch circuit N times, which contributes to an increase in the operating speed.

Figures 12, 13:
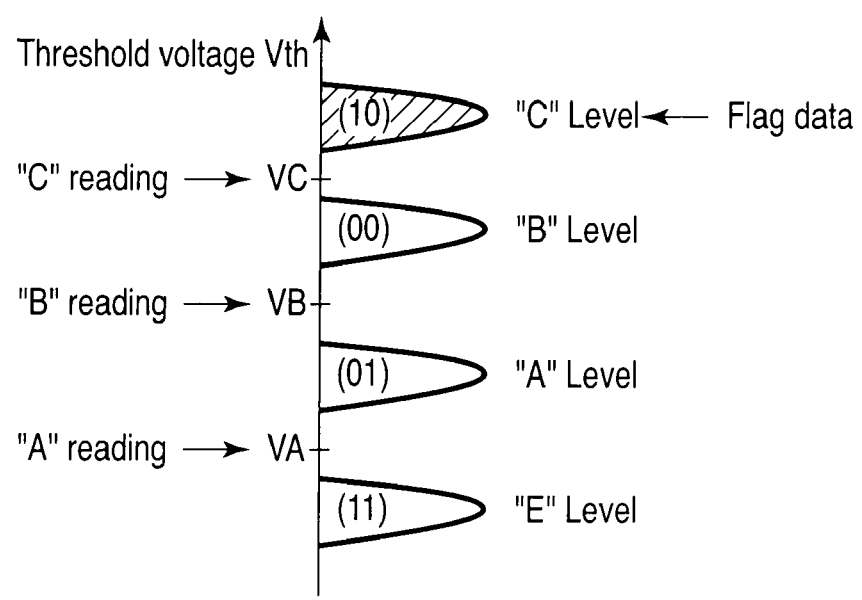
FIG. 12 is a conceptual diagram of a page buffer according to the first embodiment.
FIG. 13 is a graph showing a threshold value distribution of a memory cell according to a second embodiment.

Although not shown in FIG. 1, the first embodiment may be applied to a NAND flash memory using redundancy techniques. Redundancy techniques are for remedying defects by replacing defective memory cell transistors MT (columns) with redundant cells (redundant columns). FIG. 12 is a conceptual diagram of page data when redundancy techniques are used. As shown in FIG. 12, not only net data and flag data but also a redundant data area is provided. If there is a defect in column C3 of FIG. 3, flag data is stored in the redundancy data area. The first embodiment may be applied to such a case.

[Second Embodiment]

Next, a method of reading data in a semiconductor memory device according to a second embodiment will be explained. The second embodiment is such that data can be read without determining column C and without reading flag data explained with reference to FIGS. 6 to 9 in the first embodiment. Hereinafter, only what differs from the first embodiment will be explained.

Like FIG. 2, FIG. 13 is a graph showing a threshold distribution of a memory cell transistor MT according to the second embodiment. In the second embodiment, flag data is written into a memory cell transistor MT with the highest threshold value ("C" level). That is, on a word line for which data has been written up to the upper page, a memory cell transistor MT with "C" level is present at least in the position of column C3.

Next, a method of reading data according to the second embodiment will be explained with reference to FIGS. 14 and 15. FIG. 14 is a flowchart for reading the lower page and FIG. 15 is a flowchart for reading the upper page. As described above, when data is read, the processes of FIGS. 6 to 9 explained in the first embodiment are not needed.

Data is read, beginning with, for example, the lower page. As shown in FIG. 14, the control circuit 7 performs "C" reading (step S40). That is, in FIG. 5, the control circuit 7 sets voltage VCGR=VC to perform reading.

Then, the control circuit 7 receives the result in step S40 and compares the number of memory cell transistors MT holding data with the highest threshold level ("C" level) with a predetermined expected value (step S41).

If the number of memory cell transistors MT with "C" level is not less than the expected value, that is, there are many memory cell transistors MT with "C" level for the word line WL, the control circuit 7 determines that data has been written up to the upper page (i.e. data has been written to both the lower page and the upper page) for the word line WL (YES in step S41). Accordingly, the control circuit 7 then performs "B" reading (step S43), thereby determining data of the lower page (step S44).

In step s41, if the number of memory cell transistors MT is less than the expected value, that is, there is a small number of memory cell transistors MT with "C" level for the word line WL, the control circuit 7 determines that data has been written only to the lower page for the word line WL (NO in step S41). Accordingly, the control circuit 7 then performs "A" reading (step S42), thereby determining data of the lower page (step S44).

After the process of FIG. 14, the upper page is read. As shown in FIG. 15, the control circuit 7 performs "A" reading (step S45) and then "C" reading (step S46). That is, in FIG. 5, the control circuit 7 sets voltage VCGR=VA, VC to perform reading sequentially.

Thereafter, on the basis of the result of step S47, the control circuit 7 compares the number of memory cell transistors MT holding data with the highest threshold level ("C" level) with a predetermined expected value (step S47). The contents of the process to be carried out in this step are the same as those of step S41 of FIG. 14.

If the number of memory cell transistors MT holding "C" level is not less than the expected value, the control circuit 7 determines that data has been written up to the upper page for the word line WL (YES in step S47). Accordingly, the control circuit 7 determines the upper page on the basis of the results of steps S45 and S46 (step S48).

In step S47, if the number of memory cell transistors MT holding "C" level is less than the expected value, the control circuit 7 resets the data of the upper page (step S49) and determines data (step S48).

<Effect of the Second Embodiment>

As described above, the method of reading data in the semiconductor memory device of the second embodiment can improve the operation performance, while suppressing an increase in the circuit size. This effect will be explained below.

In the second embodiment, flag data is written with the highest threshold level. Then, it is determined according to the number of memory cell transistors MT with the highest threshold level whether data has been written up to the upper page for the word line WL.

Accordingly, there is no need to search for flag data in reading data. The reason is that, if data has been written up to the upper page for the word line WL, no fewer than a specific number of memory cell transistors MT (memory cell transistors MT each having flag data) have the highest threshold level.

Therefore, the processes of FIGS. 6 and 9 explained in the first embodiment are not needed, which enables the operating speed to be increased further. Of course, a decoder for searching for flag data is not needed and the control circuit 7 need not hold column number "N" for holding flag data, which suppresses an increase in the circuit size.

[Third Embodiment]

Next, a method of reading data in a semiconductor memory device according to a third embodiment will be explained. The third embodiment relates to a method of randomizing data to be written into a memory cell array and eliminating flag data. Hereinafter, only what differs from the first embodiment will be explained.

FIG. 16 is a block diagram of a NAND flash memory according to the third embodiment. As shown in FIG. 16, the NAND flash memory 1 of the third embodiment is such that the configuration of FIG. 1 explained in the first embodiment further comprises a scramble circuit 9.

The scramble circuit 9 randomizes externally supplied data in writing data and transfers the randomized data to the page buffer 5. More specifically, the scramble circuit 9 generates pseudo-random numbers using, for example, an address signal as a scramble seed and randomizes write data using the generated pseudo-random numbers. Of course, the randomize method is not limited to this. The scramble circuit 9 receives read data from the page buffer 5 in reading data. Then, for example, the scramble circuit 9 generates a pseudo-random number using, for example, an address signal as a scramble seed and decodes read data using the random number.

The memory cell array 2 need not have flag data.

A method of reading data is the same as explained in FIGS. 14 and 15 of the second embodiment.

<Effect of the Third Embodiment>

As described above, the method of reading data in the semiconductor memory device produces the same effect as that of the second embodiment.

With the recent miniaturization of NAND flash memory, a concentration of write data in any column sometimes becomes a problem. Specifically, for example, if "E" levels or "C" levels concentrate in a certain column, the charge amount differs from column to column. In addition, when the same data items are consecutive in the memory cell array 2, charge concentrates in any column. A concentration of charge in any column contributes to erroneous writing.

To overcome this problem, the scramble circuit 9 randomizes write data in the third embodiment. The randomization of data causes "E" level, "A" level, "B" level, and "C" level to be distributed uniformly between columns and between rows. That is, charge is distributed uniformly in the memory cell array 2.

Then, it is conceivable that a memory cell transistor MT with "C" level is almost certain to be present on word line WL for which data has been written up to the upper page. Accordingly, the number of memory cell transistors MT with "C" level is compared with an expected value, thereby determining whether data has been written up to the upper page for the word line WL. Therefore, the third embodiment needs no flag data, making unnecessary column C3 provided for holding flag data in, for example, FIG. 3, which contributes to a reduction in the circuit size.

In the example of FIG. 16, the NAND flash memory 1 itself has the scramble circuit 9. However, the NAND flash memory 1 itself may not have the scramble circuit 9. In this case, for example, a host unit (memory controller) that outputs data and instructions to the NAND flash memory 1 randomizes data. The randomized data is supplied to the NAND flash memory 1. The host unit decodes data output from the NAND flash memory 1.

As described above, the method of reading data in the semiconductor memory device according to the first to third embodiments is a method of reading data in a semiconductor memory device 1 which includes a plurality of memory cells MT associated with rows and columns C and a plurality of latch circuits 11 associated with the columns Ci. The method includes: step S22 of reading flag data from the memory cell transistors MT associated with one of the columns C3 into the associated one of the latch circuits 11-3; steps S25 to S27 of selecting one of the latch circuits 11-$i$ sequentially, while shifting one of the latch circuits 11-$i$ to be read from; and step S28 of reading the flag data from one of the latch circuits 11-N selected by an $N^{th}$ shift (N being a natural number not less than 0).

In addition, the method of reading data in the semiconductor memory device according to the first to third embodiments is a method of reading data in a semiconductor memory device 1 capable of reading data en bloc from a plurality of memory cell transistors MT capable of holding 2-bit or more data according to the threshold level. The method includes: step S40 of reading the data en bloc from said plurality of memory cell transistors MT by use of a first voltage level VC to determine whether data with the highest threshold level ("C" level) in the 2-bit or more data is present or absent; and step S41 of determining according to the number of memory cell transistors MT having data with the highest threshold level whether the data read en bloc is 2-bit or more data or 1-bit data.

With the above methods, the operation performance of the semiconductor memory device 1 can be improved, while suppressing an increase in the circuit size of the semiconductor memory device 1.

The first to third embodiments are particularly effective for a configuration including, for example, a cache memory.

The cache memory is provided in front of a data buffer. Externally supplied write data is first stored in the cache memory and then is transferred to the page buffer 5. Data read into the page buffer is transferred to the cache memory, which then outputs the data to the outside. Accordingly, even when the memory cell transistor MT is being written into, if the cache memory becomes empty, the NAND flash memory goes into the ready state and can accept data from the outside. In reading data, a preparation for the next read operation can be made with the page buffer 5, while the cache memory is outputting to the outside the read data transferred from the page buffer 5 (this process is called cache read).

When flag data is read with a decoder during cache read, a data line must be used to transfer the flag data, because the same data line is also used to output data from the cache memory to the outside. Therefore, it is difficult to carry out the two operations at the same time. More specifically, for example, after data is output from the cache memory, flag data must be checked, which prevents the operation from being made faster.

However, with the configuration of the first embodiment, flag data is stored as the number of failure bits in the pass/fail circuit 6. Then, the control circuit 7 acquires the flag data by checking the failure bits. Accordingly, there is no need to use a data line. In addition, with the second and third embodiments, flag data itself need not be read. Therefore, the above problem is solved and the advantage of providing a cache memory can be utilized to a maximum extent.

The read sequences shown in FIGS. 10, 11, 14, and 15 explained in the first to third embodiments are not limited to the explained orders and may be modified suitably. For instance, data may be determined, starting with the upper page, provided that step S41 in the second and third embodiments is carried out after the highest threshold level is read (step S40).

In the first to third embodiments, the memory cell transistors MT can hold two bits of data, that is, each of the word lines has the upper page and lower page. However, the memory cell transistors MT may hold no fewer than three bits (eight levels) of data. For instance, when the memory cell transistors MT hold three bits of data, each of the word lines has the upper page, middle page, and lower page. In this case, too, the first embodiment is applied without any modification. The second and third embodiments are also applied without any modification in that a determination is made on the basis of the number of off cells when the highest read level is used (steps S41, S47).

In the first embodiment, the operation of determining column C has been explained using a case where a column to be selected is shifted sequentially, starting with column C0 at the end of memory cell array 2. However, a column which has flag data is only column C3 in FIG. 3 or a redundancy area to be replaced with column C3. Therefore, the control circuit 7 may search only column C3 and redundancy column for a column holding flag data. This can be realized when, for example, the control circuit 7 generates an enable signal to search only column C3 and a redundancy column. This causes only a minimum number of columns to be searched, making operation faster.

This approach can also be applied to the second embodiment. Specifically, steps S41 and S47 in the second embodiment may be carried out for only column C3 and the redundancy column. That is, the number of "C" levels included in column C3 and the redundancy column may be compared with the expected value. This enables flag data to be read more accurately.

Furthermore, in the first embodiment, the operation of determining column C has been explained with reference to FIG. 6. However, the first embodiment is not necessarily limited to FIG. 6. That is, the number "N" of the column corresponding to flag data may be stored in advance in any area of the memory cell array 2. For instance, the number "N" is stored in an area which stores redundancy information or an area which stores other important data (e.g., information on voltage VREAD differing from chip to chip). Then, the number "N" may be read at the time of power-on.

For example, suppose a column for flag data contains is 16 bits and the flag data is 12 bits. In this case, for example, in a NAND flash memory chip where a failure bits are four or fewer bits in every column, if the number of "C" levels is 6 or more bits as a result of steps S41 and S47, flag data can be read without problem. However, if a failure bits are 30 or more bits, it is very difficult to read flag data correctly and the process becomes complex.

To overcome this problem, only column C3 and the redundancy column are dealt with in steps S41 and S47, which enables the flag data to be read accurately, provided that the bits number is no fewer than six to ten.

Figure 17:
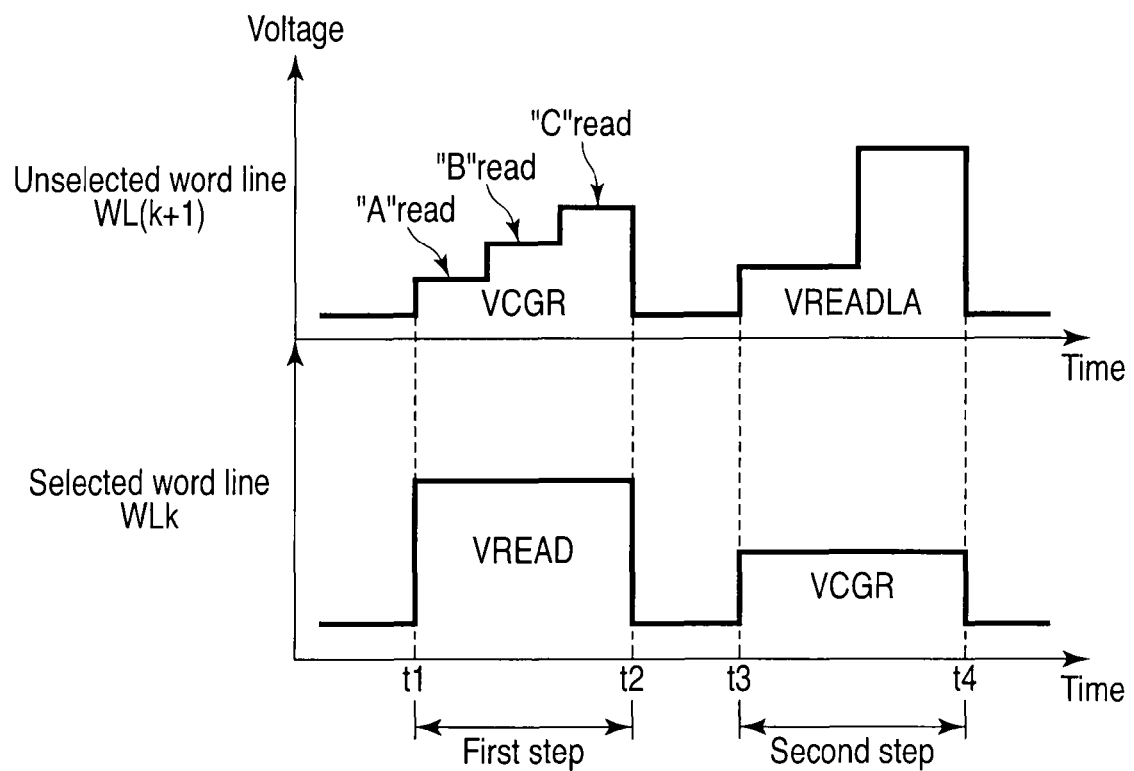
FIG. 17 is a timing chart showing changes in the potential of word lines in a flash memory according to a modification of the second and third embodiments.

The first to third embodiments are particularly effective in reading data, taking into account the effect of adjacent memory cell transistors MT. This will be explained with reference to FIG. 17. FIG. 17 is a graph showing a change in the potential of selected word line WLk (k being a natural number) and a change in the potential of unselected word line WL(k+1) when data is read.

As shown in FIG. 17, the operation of reading data includes a first step carried out in a period between times t1 and t2 and a second step carried out in a period between times t3 and t4.

In the first step, data is read from unselected memory cell transistor MT(k+1) connected to unselected word line WL(k+1) located closer to the drain side than selected word line WLk is. This is done to determine the effect of coupling between charge accumulation layers on the selected memory cell transistor MT. The threshold voltage of the memory cell transistor MT might become apparently higher due to the effect of adjacent memory cell transistors MT. The effect differs according to the data held in the adjacent memory cell transistors MT. In the first step, therefore, data is read from unselected memory cell transistor MT(k+1) to check the data in advance. To do this, voltage VREAD is applied to selected word line WLk and voltage VCGR is applied to unselected word line WL(k+1) in the first step.

In the second step, data is read from selected memory cell transistor MTk connected to selected word line WLk. That is, voltage VCGR is applied to selected word line WLk and voltage VREADLA is applied to unselected word line WL(k+1). The value of voltage VREADLA is a value corresponding to the data read from memory cell transistor MT(k+1).

As described above, there are various methods of correcting the effect of coupling. For instance, they include a method of making a correction only when the threshold level of unselected word line WL(k+1) is "A" level or "C" level and a method of making a correction for each of "A" level, "B" level, and "C" level. When the method shown in FIGS. 14 and 15 is applied to the first step in the above cases, redundant operations in the first step can be eliminated, enabling the operation to be made faster.

While in the first to third embodiments, flag data has been "81H," the embodiments are not limited to this value. Moreover, in the above embodiments, flag data has been the number of pages allocated to the corresponding word line, in other words, the amount of information a memory cell to be read can hold. However, the flag data may be other information. That is, flag data is not particularly restricted, provided that it is unique data written in a memory cell. For instance, the flag data may be data which indicates whether data in each word line is inhibited to be erased or not. As in the second embodiment, flag data may be written using the highest threshold value in the first embodiment.

While in the embodiments, a NAND flash memory has been used, for example, a NOR, a DINOR, or AND flash memory may be used. Moreover, the embodiments may be applied to not only flash memories but also semiconductor memories in general, such as magnetic random access memory (MRAM) using a magnetoresistive element as a memory cell or resistance random access memory (ReRAM) using a variable resistive element. When flag data explained in the first to third embodiments is used, the embodiments may be applied to semiconductor memories capable of holding two or more bits of data in a single memory cell.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of reading data in a semiconductor memory device including a plurality of memory cells associated with rows and columns and a plurality of latch circuits associated with the columns, the method comprising:
reading flag data from the memory cells associated with one of the columns into associated one of the latch circuits;
selecting one of the latch circuits sequentially, while shifting one of the latch circuits to be selected; and
reading the flag data from one of the latch circuits selected in an $N^{th}$ one of the shifts (N being an integer not less than 0).

2. The method according to claim 1, further comprising executing a read sequence of reading data from the memory cells associated with one of the rows after the flag data is read,
wherein the flag data is information indicating the number of bits one of the memory cells is capable of holding, and
the read sequence depends on the number of bits one of the memory cells is capable of holding.

3. The method according to claim 2, wherein the read sequence includes a first sequence and a second sequence,
the first sequence includes determining read data by use of a first voltage level and determining read data by use of a second voltage level lower than the first voltage level according to the flag data, and
the second sequence includes determining read data by use of the second voltage level, determining read data by use of a third voltage level higher than the first voltage level, and resetting a determination result in the second sequence according to the flag data.

4. The method according to claim 3, wherein the memory cells are configured to be capable of holding 1-bit or 2-bit data, and
in the first sequence,
when the memory cells hold the 1-bit data, the data is identified by the determining using the second voltage level,
when the memory cells hold the 2-bit data, one bit of the 2-bit data is identified by the determining using the first voltage level,
in the second sequence,
when the memory cells hold the 2-bit data, other bit of the 2-bit data is identified by the determining using the second voltage level and the third voltage level.

5. The method according to claim 1, further comprising:
causing one of the latch circuits to hold the flag data before reading the flag data from the memory cells;
selecting one of the latch circuits sequentially, while shifting one of the latch circuits to be selected; and
determining whether data in the one of the latch circuits is the flag data each time the one of the latch circuits is selected,
wherein the number of shifts is determined to be N when one of the latch circuits holding the flag data is selected.

6. The method according to claim 5, further comprising storing data distinguishable from the flag data into the latch circuits in which the flag data is not held, before the selecting one of the latch circuits sequentially.

7. The method according to claim 6, wherein the data distinguishable from the flag data is such that all bits are "1s" or "0s".

8. The method according to claim 7, wherein the flag data is determined on the basis of the number of binary "1s" or binary "0s" in data in each of the latch circuits.

9. The method according to claim 5, wherein N is determined immediately after the device is powered on.

10. The method according to claim 1, wherein the flag data corresponds to information capacity each of the memory cells to be read from is capable of holding.

11. A method of reading data in a semiconductor memory device where data is capable of being read en bloc from a plurality of memory cells capable of holding 2-bit or more data according to a threshold level, the method comprising:
reading the data en bloc from the memory cells by use of a first voltage level to determine whether data with the highest threshold level in the 2-bit or more data is present or absent; and
determining according to the number of memory cells having data with the highest threshold level whether data from each of the memory cells, when the data is read en block, is 2-bit or more data or 1-bit data.

12. The method according to claim 11, further comprising:
executing a first sequence; and
executing a second sequence,
wherein the first sequence includes the reading, the determining, and reading the data by use of a second voltage level or a third voltage level lower than the first voltage level according to a result of the determining, and
the second sequence includes reading the data by use of the second voltage level, reading the data by use of the first voltage level, and resetting the result of reading in the second sequence according to a result of reading the data by use of the first voltage level.

13. The method according to claim 12, wherein the memory cells are configured to be capable of holding 1-bit data or 2-bit data, and
in the first sequence,
when the memory cells hold the 1-bit data, the data is identified by the reading using the second voltage level,
when the memory cells hold the 2-bit data, one bit of the 2-bit data is identified by the reading using the third voltage level,
in the second sequence,
when the memory cells hold the 2-bit data, other bit of the 2-bit data is identified by the reading using the second voltage level and the first voltage level.

14. The method according to claim 11, wherein the data read en bloc includes flag data corresponding to information capacity each of the memory cells to be read from is capable of holding, and
the flag data is written into the memory cells with the highest threshold level.

15. The method according to claim 11, further comprising decoding data read from the memory cells.

16. The method according to claim 15, wherein the data held in the memory cells has been scrambled with pseudo-random numbers.

17. The method according to claim 11, wherein the determining is performed using a part of the data read en bloc.

* * * * *